(12) United States Patent
Toda

(10) Patent No.: US 12,482,973 B2
(45) Date of Patent: Nov. 25, 2025

(54) ASSEMBLY AND HARNESS ASSEMBLY

(71) Applicant: JAPAN AVIATION ELECTRONICS INDUSTRY, LIMITED, Tokyo (JP)

(72) Inventor: Kentaro Toda, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 526 days.

(21) Appl. No.: 17/971,472

(22) Filed: Oct. 21, 2022

(65) Prior Publication Data

US 2023/0187865 A1 Jun. 15, 2023

(30) Foreign Application Priority Data

Dec. 9, 2021 (JP) ................................. 2021-199893

(51) Int. Cl.
*H05K 1/14* (2006.01)
*H01L 23/13* (2006.01)
(Continued)

(52) U.S. Cl.
CPC .......... *H01R 12/732* (2013.01); *H01L 23/13* (2013.01); *H01L 23/49805* (2013.01);
(Continued)

(58) Field of Classification Search
CPC ..... H01R 12/732; H01R 13/665; H01L 23/13; H01L 23/49805; H05K 1/142; H05K 2201/049; H05K 2201/10378
(Continued)

(56) References Cited

U.S. PATENT DOCUMENTS

| 4,725,920 A | 2/1988 | Ijichi et al. |
| 5,661,336 A * | 8/1997 | Phelps, Jr. ............. H01L 24/06 257/676 |

(Continued)

FOREIGN PATENT DOCUMENTS

| DE | 102018111554 A1 | 11/2019 |
| JP | S60106362 U | 7/1985 |

(Continued)

OTHER PUBLICATIONS

Extended European Search Report (EESR) dated Sep. 12, 2023, issued in counterpart European Application No. 22204403.4.
(Continued)

*Primary Examiner* — Binh B Tran
(74) *Attorney, Agent, or Firm* — Holtz, Holtz & Volek PC

(57) ABSTRACT

An assembly comprises a circuit board structure and a plurality of connection portions. The circuit board structure has a main circuit board and a supplemental circuit board. The main circuit board is formed with an accommodating portion. The accommodating portion is recessed downward in an up-down direction from an upper surface of the main circuit board. The main circuit board has a plurality of upper main conductive portions which are formed on the upper surface of the main circuit board. The supplemental circuit board has a plurality of upper supplemental conductive portions which are formed on an upper surface of the supplemental circuit board. The supplemental circuit board is, at least in part, accommodated in the accommodating portion. Each of ones of the connection portions connects a respective one of the upper main conductive portions and a respective one of the upper supplemental conductive portions with each other.

10 Claims, 13 Drawing Sheets

(51) Int. Cl.
   *H01L 23/498* (2006.01)
   *H01R 12/73* (2011.01)
   *H01R 13/66* (2006.01)

(52) U.S. Cl.
   CPC ........... *H01R 13/665* (2013.01); *H05K 1/142* (2013.01); *H05K 2201/049* (2013.01); *H05K 2201/10378* (2013.01)

(58) Field of Classification Search
   USPC ......................................................... 361/792
   See application file for complete search history.

(56) References Cited

U.S. PATENT DOCUMENTS

| | | | |
|---|---|---|---|
| 2009/0325345 A1* | 12/2009 | Sasaki | H01L 24/49 257/E23.173 |
| 2019/0081422 A1 | 3/2019 | Chuang et al. | |
| 2021/0313718 A1 | 10/2021 | Lim et al. | |

FOREIGN PATENT DOCUMENTS

| | | |
|---|---|---|
| JP | H05327272 A | 12/1993 |
| JP | 2001258126 A | 9/2001 |
| JP | 2014175386 A | 9/2014 |
| JP | 2015144159 A | 8/2015 |
| WO | 2008134809 A1 | 11/2008 |

OTHER PUBLICATIONS

Extended European Search Report (EESR) dated Feb. 3, 2025, issued in European Application No. 24202484.2.
Partial European Search Report dated May 9, 2023, issued in counterpart European Application No. 22204403.4.
European Office Action dated May 28, 2024, issued in counterpart European Application No. 22204403.4.
European Office Action dated Nov. 13, 2024, issued in counterpart European Application No. 22204403.4.
Japanese Office Action (and an English language translation thereof) dated Jun. 18, 2025, issued in counterpart Japanese Application No. 2021-199893.

* cited by examiner

ASSEMBLY AND HARNESS ASSEMBLY

CROSS REFERENCE TO RELATED APPLICATIONS

This application is based on and claims priority under 35 U.S.C. § 119 to Japanese Patent Application No. JP2021-199893 filed Dec. 9, 2021, the contents of which are incorporated herein in their entirety by reference.

BACKGROUND OF THE INVENTION

This invention relates to an assembly which comprises a circuit board structure having a main circuit board and a supplemental circuit board.

As shown in FIGS. 25 and 26, JPA2015-144159 (Patent Document 1) discloses an assembly 900 of this type. The assembly 900 comprises a circuit board structure 910 and a semiconductor element 950, or a device 950. The circuit board structure 910 has a circuit board 920 and an interposer 940. A positive Z-surface of the circuit board 920 is formed with a plurality of electrical pads 922. The interposer 940 has a plurality of contacts 942. The device 950 is mounted on the interposer 940 of the circuit board structure 910. A negative Z-surface of the device 950 is formed with a plurality of electrical pads 952. The interposer 940 electrically connects the electrical pad 952 of the device 950 with the electrical pad 922 of the circuit board 920 via the contact 942.

The circuit board structure 910 of Patent Document 1 has a drawback that the circuit board structure 910 has an increased size in a Z-direction, or in a height direction.

SUMMARY OF THE INVENTION

It is therefore an object of the present invention to provide an assembly comprising a circuit board structure which has a reduced size in a height direction.

One aspect (first aspect) of the present invention provides an assembly comprising a circuit board structure and a plurality of connection portions. The circuit board structure has a main circuit board and a supplemental circuit board. The main circuit board has an upper surface and a lower surface in an up-down direction. The main circuit board is formed with an accommodating portion. The accommodating portion is recessed downward in the up-down direction from the upper surface of the main circuit board. The main circuit board has a plurality of upper main conductive portions. The upper main conductive portions are formed on the upper surface of the main circuit board. The supplemental circuit board has an upper surface and a lower surface in the up-down direction. The supplemental circuit board has a plurality of upper supplemental conductive portions. The upper supplemental conductive portions are formed on the upper surface of the supplemental circuit board. The supplemental circuit board is, at least in part, accommodated in the accommodating portion. Each of ones of the connection portions connects a respective one of the upper main conductive portions and a respective one of the upper supplemental conductive portions with each other.

Another aspect (second aspect) of the present invention provides a harness assembly comprising the assembly of the first aspect, a connector and an electrical wire. The assembly further comprises a device which has a device connection portion. The device is mounted on the supplemental circuit board. The device connection portion is connected with the upper supplemental conductive portion. The main circuit board has a front end and a rear end in a front-rear direction perpendicular to the up-down direction. The front end of the main circuit board is connected with the connector. The rear end of the main circuit board is connected with the electrical wire.

The assembly of the present invention is configured as follows: the main circuit board is formed with the accommodating portion; the accommodating portion is recessed downward in the up-down direction from the upper surface of the main circuit board; and the supplemental circuit board is, at least in part, accommodated in the accommodating portion. Accordingly, the assembly of the present invention comprises the circuit board structure which has a reduced size in a height direction.

An appreciation of the objectives of the present invention and a more complete understanding of its structure may be had by studying the following description of the preferred embodiment and by referring to the accompanying drawings.

Figure 1:
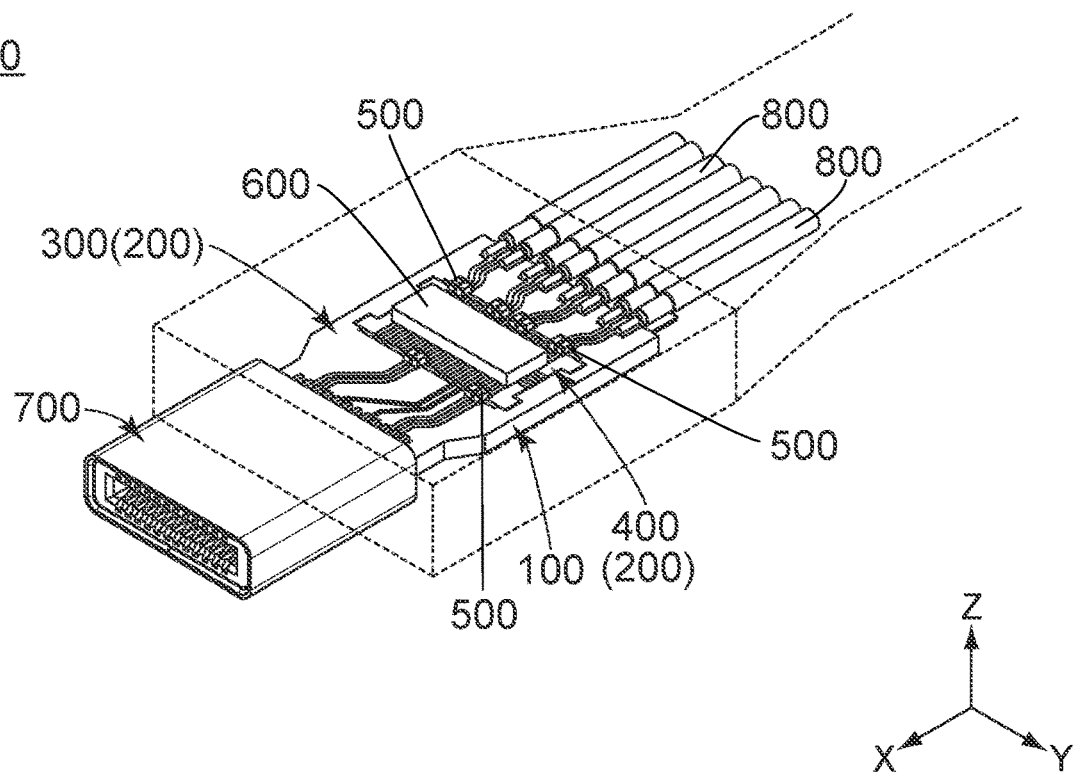
FIG. 1 is an upper, perspective view showing a harness assembly according to an embodiment of the present invention. In the figure, an outline of the harness assembly is depicted by dotted line, and a device is mounted on a supplemental circuit board.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

As shown in FIG. 1, a harness assembly 10 according to an embodiment of the present invention comprises an assembly 100, a connector 700 and electrical wires 800.

As shown in FIG. 1, the connector 700 of the present embodiment is a plug. The connector 700 is mateable with a mating connector (not shown), which is positioned forward of the connector 700, from behind the mating connector along a front-rear direction. In the present embodiment, the front-rear direction is an X-direction. Specifically, forward is a positive X-direction while rearward is a negative X-direction.

Figure 7:
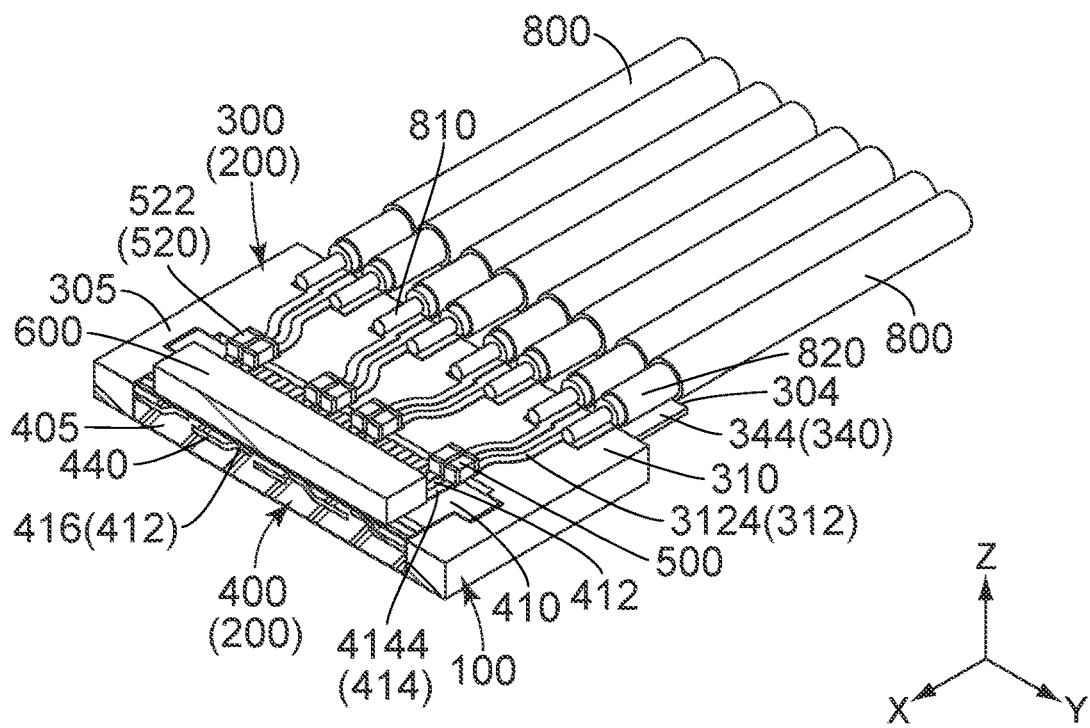
FIG. 7 is a cross-sectional, perspective view showing the harness assembly of FIG. 1.
Figure 8:
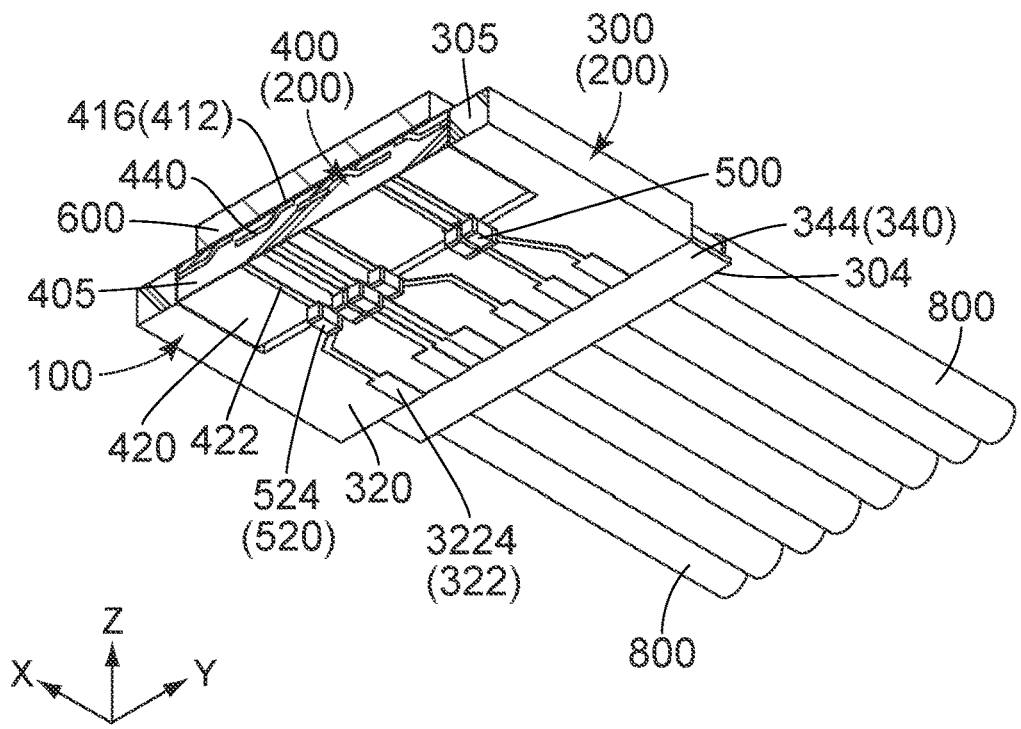
FIG. 8 is a cross-sectional, perspective view showing the harness assembly of FIG. 4.
Figure 9:
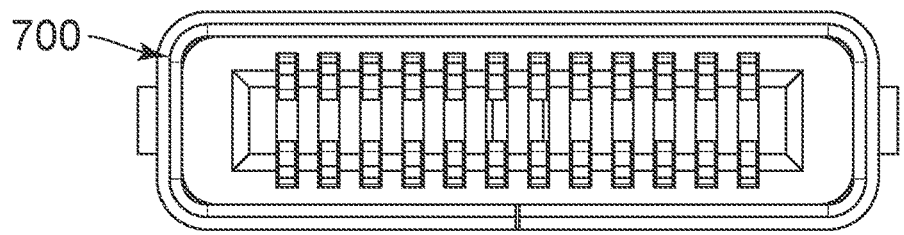
FIG. 9 is a front view showing the harness assembly of FIG. 1.
Figure 10:
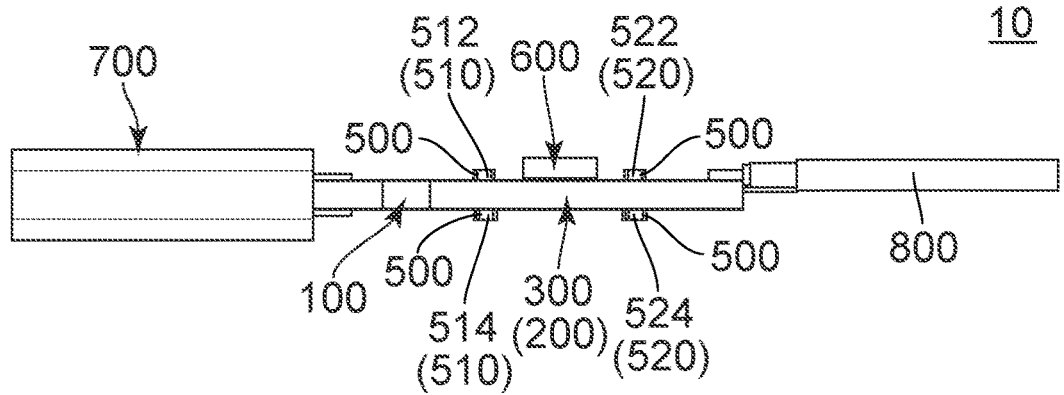
FIG. 10 is a side view showing the harness assembly of FIG. 1.
Figure 11:
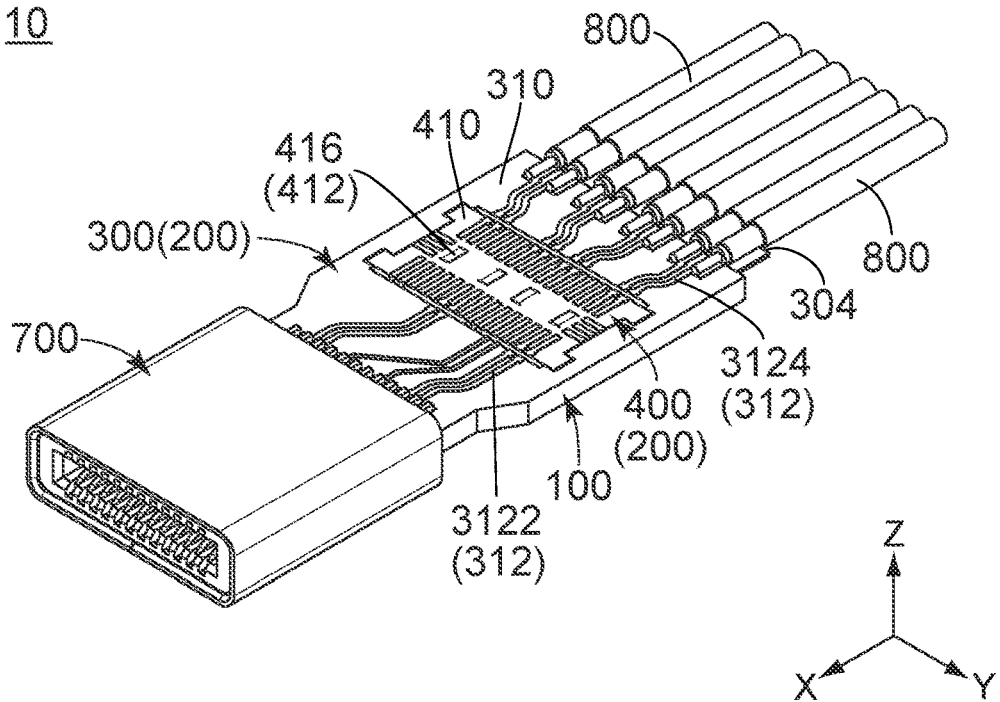
FIG. 11 is an upper, perspective view showing the harness assembly of FIG. 1. In the figure, the device and some of connection portions are omitted.
Figure 12:
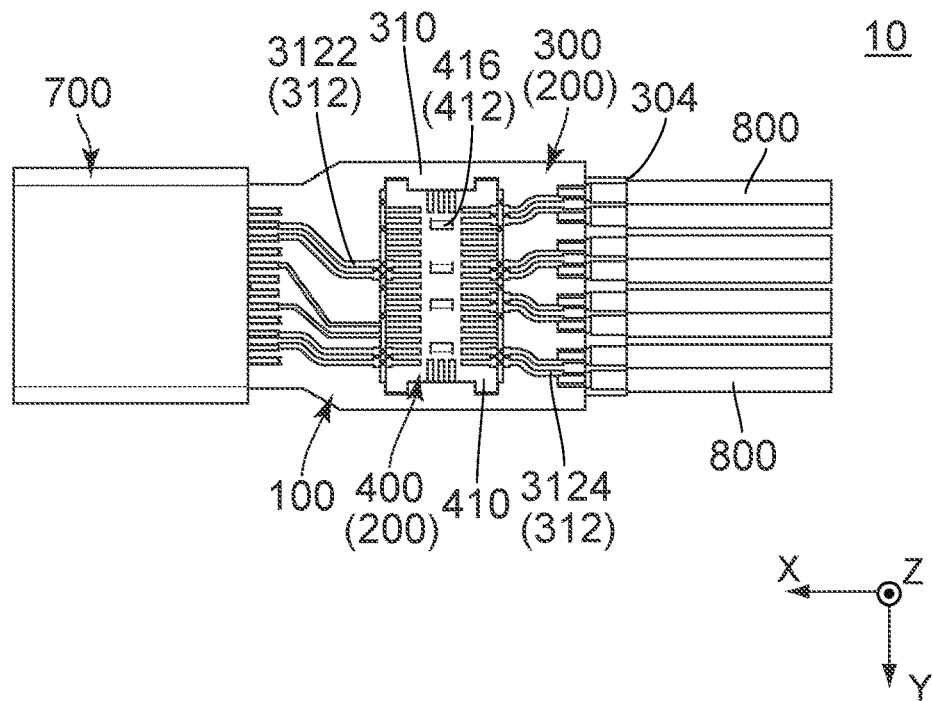
FIG. 12 is a top view showing the harness assembly of FIG. 11.
Figure 13:
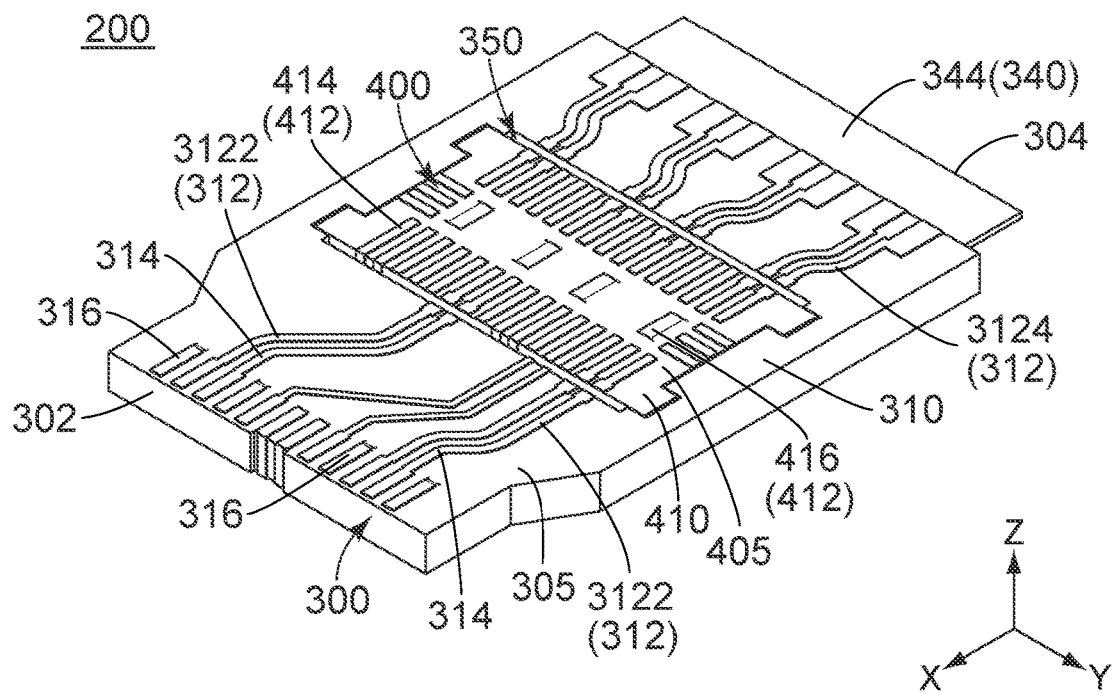
FIG. 13 is an upper, perspective view showing the harness assembly of FIG. 11. In the figure, the supplemental circuit board is accommodated in an accommodating portion of the main circuit board.

Referring to FIG. 1, the number of the electrical wires 800 of the present embodiment is two or more. However, the present invention is not limited thereto, but the number of the electrical wire 800 may be one. As shown in FIG. 7, each of the electrical wires 800 has a center conductor 810 and an outer conductor 820.

Figure 2:
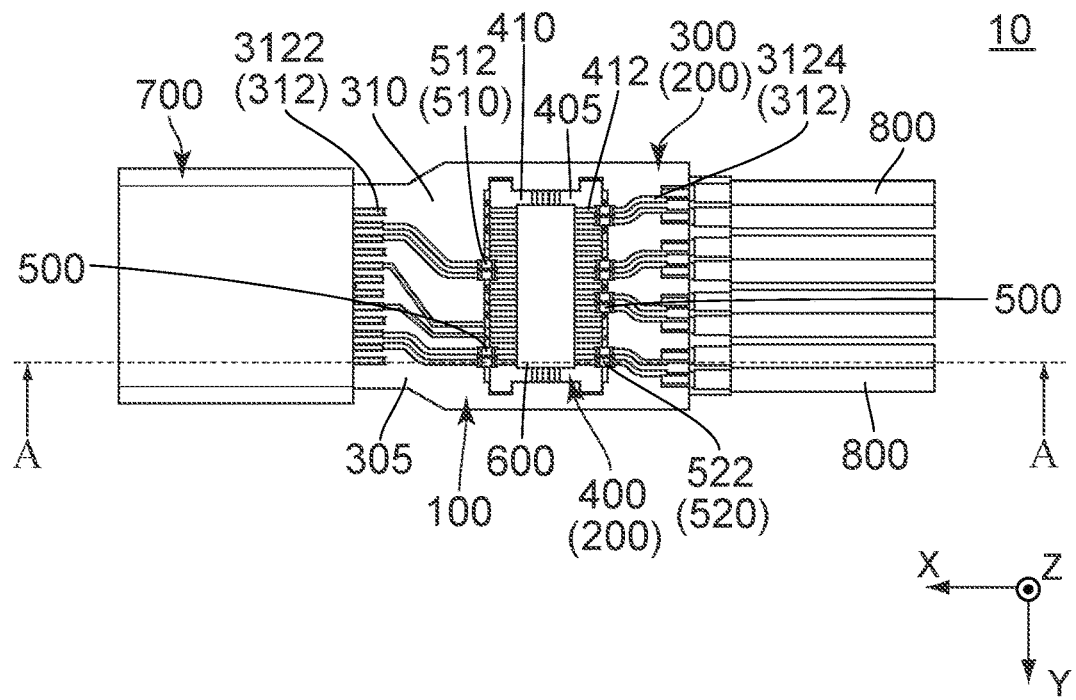
FIG. 2 is a top view showing the harness assembly of FIG. 1.

As shown in FIG. 2, the assembly 100 of the present embodiment comprises a circuit board structure 200 and a plurality of connection portions 500.

Figure 14:
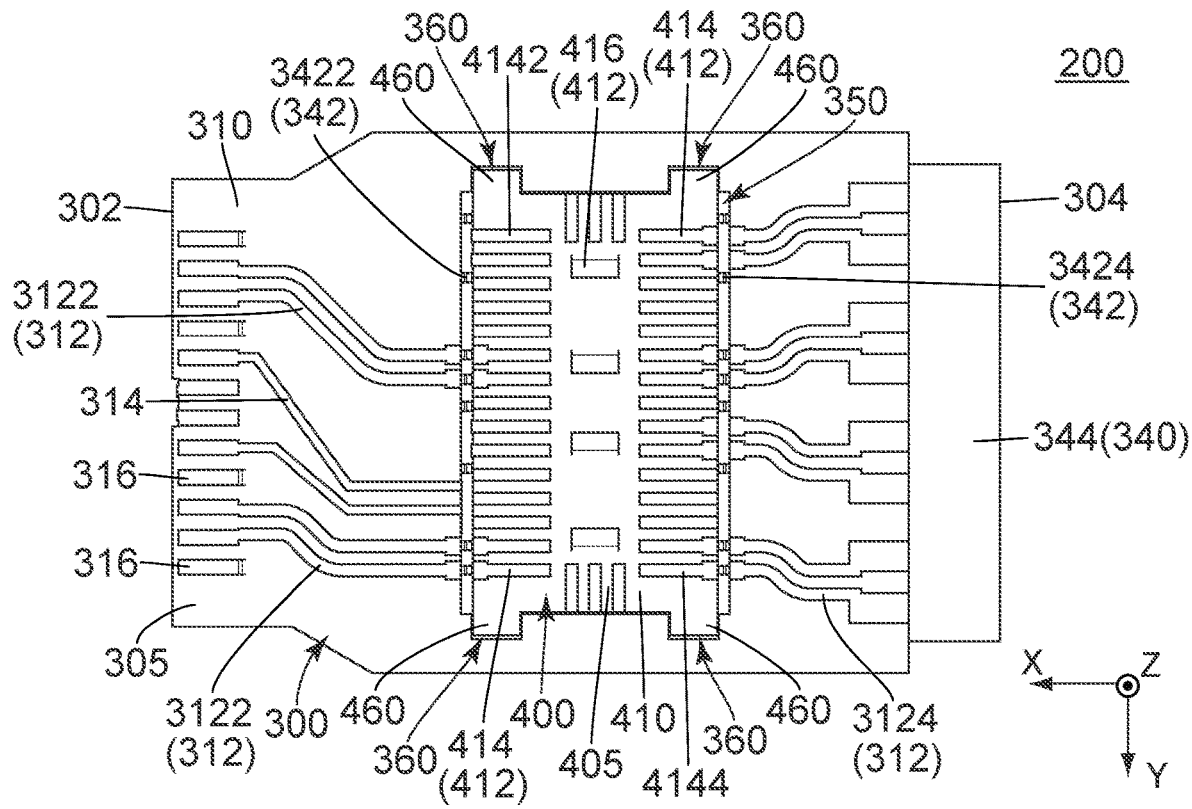
FIG. 14 is a top view showing the circuit board structure of FIG. 13.
Figure 15:
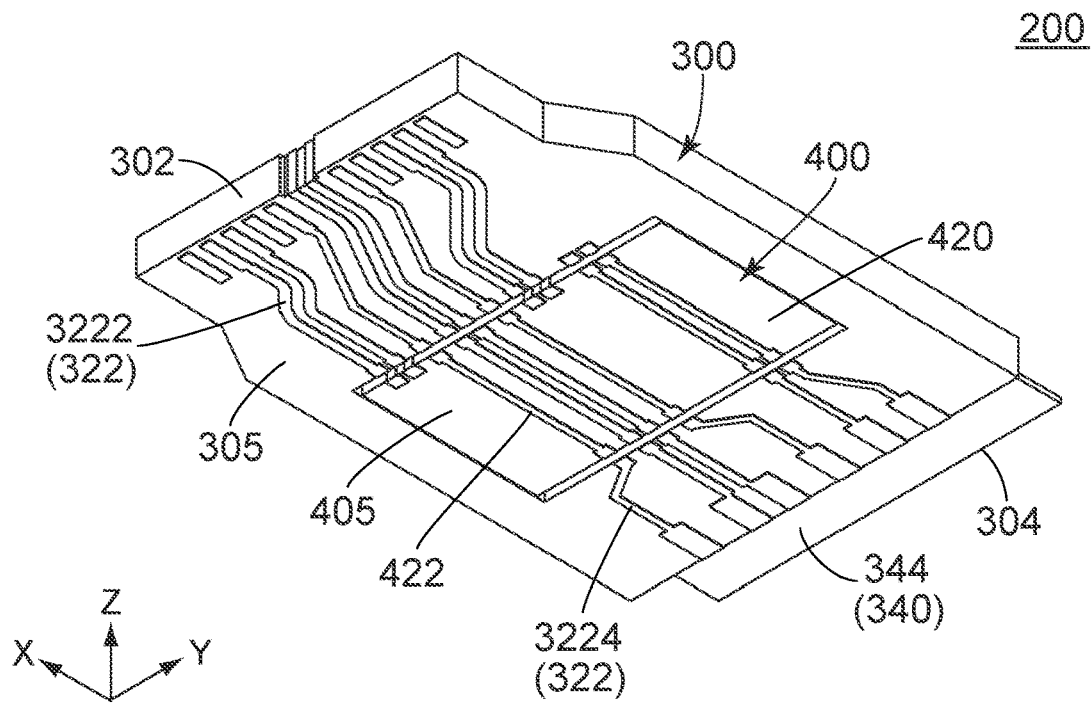
FIG. 15 is a lower, perspective view showing the circuit board structure of FIG. 13.

As shown in FIG. 14, the circuit board structure 200 of the present embodiment has a main circuit board 300 and a supplemental circuit board 400.

As shown in FIG. 14, the main circuit board 300 has a front end 302 and a rear end 304 in the front-rear direction perpendicular to an up-down direction. In the present embodiment, the up-down direction is a Z-direction. Specifically, it is assumed that upward is a positive Z-direction while downward is a negative Z-direction. In addition, the up-down direction is also referred to as a height direction of the circuit board structure 200. As understood from FIGS. 2 and 14, the front end 302 of the main circuit board 300 is connected with the connector 700, and the rear end 304 of the main circuit board 300 is connected with any of the electrical wires 800.

As shown in FIG. 14, the main circuit board 300 of the present embodiment has a main holding member 305. The main holding member 305 is made of resin. It is noted that the main circuit board 300 is not a glass epoxy substrate.

Figure 22:
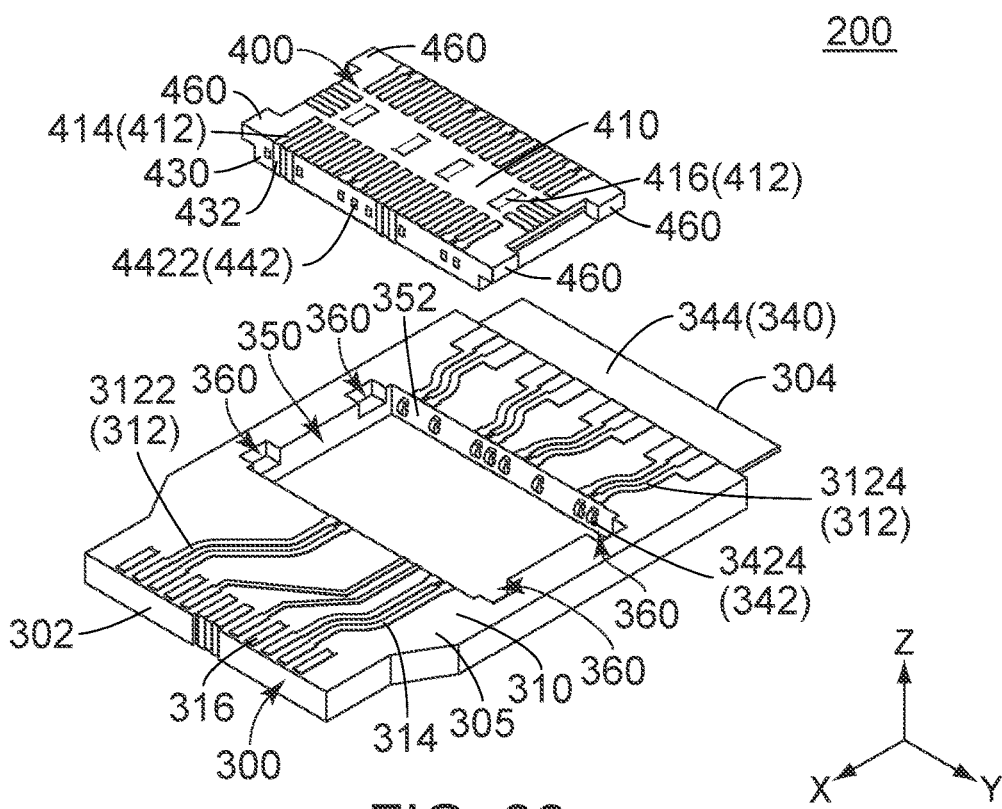
FIG. 22 is another upper, perspective view showing the circuit board structure of FIG. 13. In the figure, the supplemental circuit board is not accommodated in the accommodating portion of the main circuit board.

As shown in FIG. 22, the main circuit board 300 is formed with an accommodating portion 350.

As shown in FIG. 22, the accommodating portion 350 of the present embodiment pierces the main circuit board 300 in the up-down direction. However, the present invention is not limited thereto, but the accommodating portion 350 should be recessed downward in the up-down direction from an upper surface 310 of the main circuit board 300. In other words, the accommodating portion 350 may have a bottom surface which defines a lower end of the accommodating portion 350 in the up-down direction. The accommodating portion 350 has an inner wall surface 352.

Figure 16:
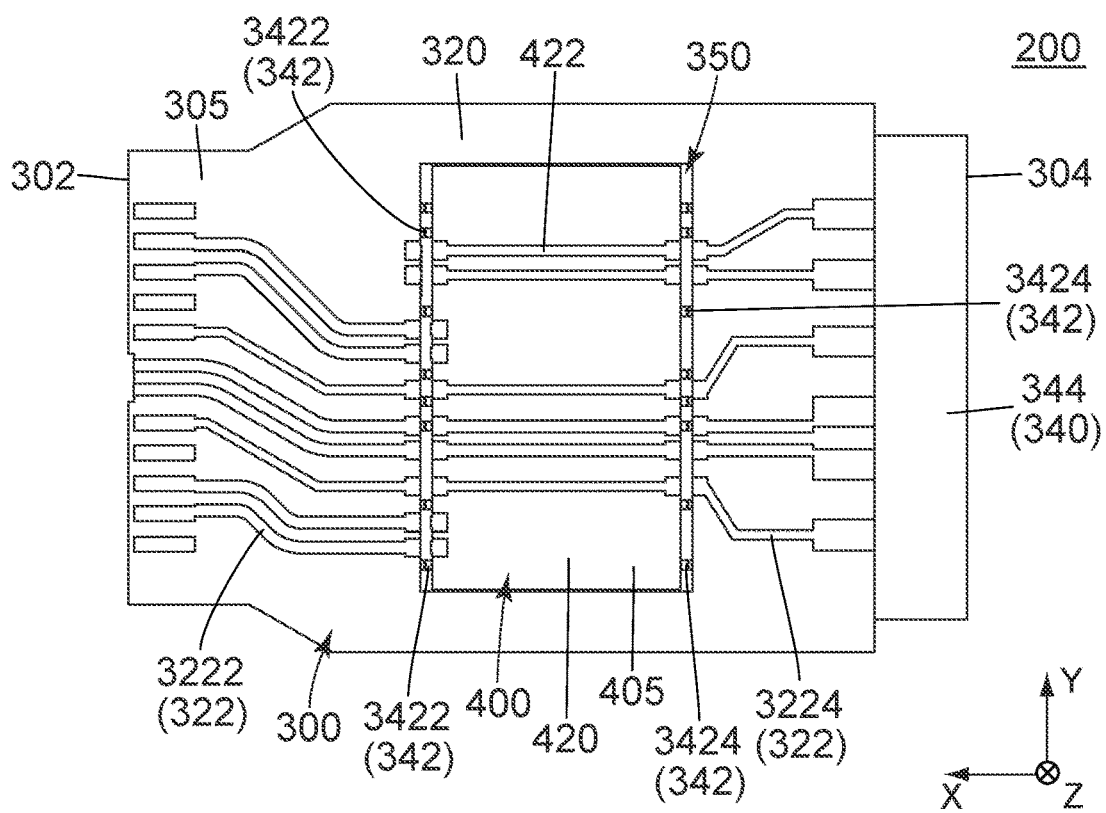
FIG. 16 is a bottom view showing the circuit board structure of FIG. 13.
Figure 17:
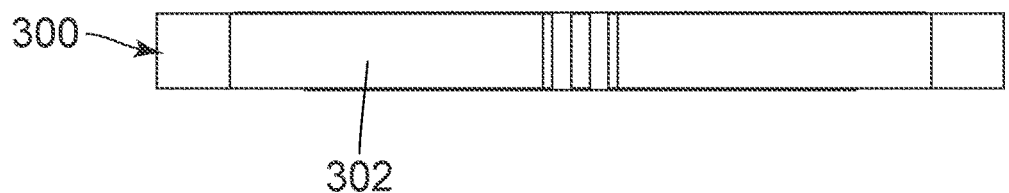
FIG. 17 is a front view showing the circuit board structure of FIG. 13.

As shown in FIGS. 14 and 16, the main circuit board 300 has the upper surface 310 and a lower surface 320 in the up-down direction.

As shown in FIG. 14, the upper surface 310 of the present embodiment faces upward in the up-down direction. The upper surface 310 is a plane perpendicular to the up-down direction. The main circuit board 300 has a plurality of upper main conductive portions 312 which are formed on the upper surface 310.

As shown in FIG. 14, the upper main conductive portions 312 of the present embodiment include first upper main conductive portions 3122 and second upper main conductive portions 3124.

As shown in FIG. 14, each of the first upper main conductive portions 3122 of the present embodiment is positioned forward of the accommodating portion 350 in the front-rear direction perpendicular to the up-down direction. The first upper main conductive portions 3122 include main traces 314 and ground connection portions 316.

Referring to FIGS. 14, each of the main traces 314 of the present embodiment is a copper wire pattern. Each of the main traces 314 is exposed on the upper surface 310 of the main circuit board 300. Each of ones of the main traces 314 extends in the front-rear direction on the upper surface 310 and reaches the accommodating portion 350.

As shown in FIG. 14, each of the ground connection portions 316 of the present embodiment is exposed on the upper surface 310 of the main circuit board 300. Each of the ground connection portions 316 is position around the front end 302 of the main circuit board 300.

As shown in FIG. 14, each of the second upper main conductive portions 3124 of the present embodiment is positioned rearward of the accommodating portion 350 in the front-rear direction. Each of the second upper main conductive portions 3124 is exposed on the upper surface 310 of the main circuit board 300. Each of the second upper main conductive portions 3124 extends in the front-rear direction from the accommodating portion 350 to a rear end of the main holding member 305.

Referring to FIG. 16, the lower surface 320 of the present embodiment faces downward in the up-down direction. The lower surface 320 is a plane perpendicular to the up-down direction. The main circuit board 300 has a plurality of lower main conductive portions 322 which are formed on the lower surface 320 of the main circuit board 300.

Referring to FIG. 16, each of the lower main conductive portions 322 of the present embodiment is a copper wire pattern. The lower main conductive portions 322 include first lower main conductive portions 3222 and second lower main conductive portions 3224.

As shown in FIG. 16, each of the first lower main conductive portions 3222 of the present embodiment is positioned forward of the accommodating portion 350 in the front-rear direction perpendicular to the up-down direction. Each of the first lower main conductive portions 3222 is exposed on the lower surface 320 of the main circuit board 300. Each of ones of the first lower main conductive portions 3222 extends in the front-rear direction on the lower surface 320 and reaches the accommodating portion 350.

As shown in FIG. 16, each of the second lower main conductive portions 3224 of the present embodiment is positioned rearward of the accommodating portions 350 in the front-rear direction. Each of the second lower main conductive portions 3224 is exposed on the lower surface 320 of the main circuit board 300. Each of the second lower main conductive portions 3224 extends in the front-rear direction from the accommodating portion 350 to the rear end of the main holding member 305.

Figure 3:
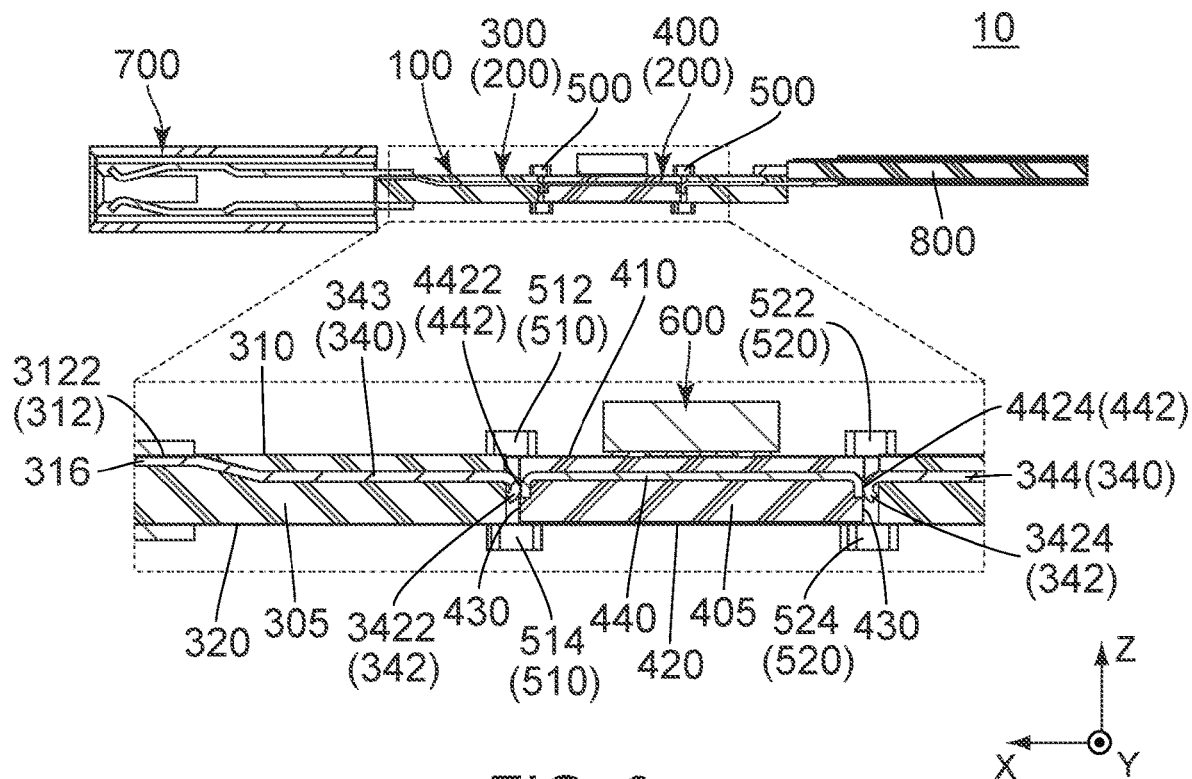
FIG. 3 is a cross-sectional view showing the harness assembly of FIG. 2, taken along line A-A. In the figure, a part of the harness assembly is enlarged and illustrated.
Figure 4:
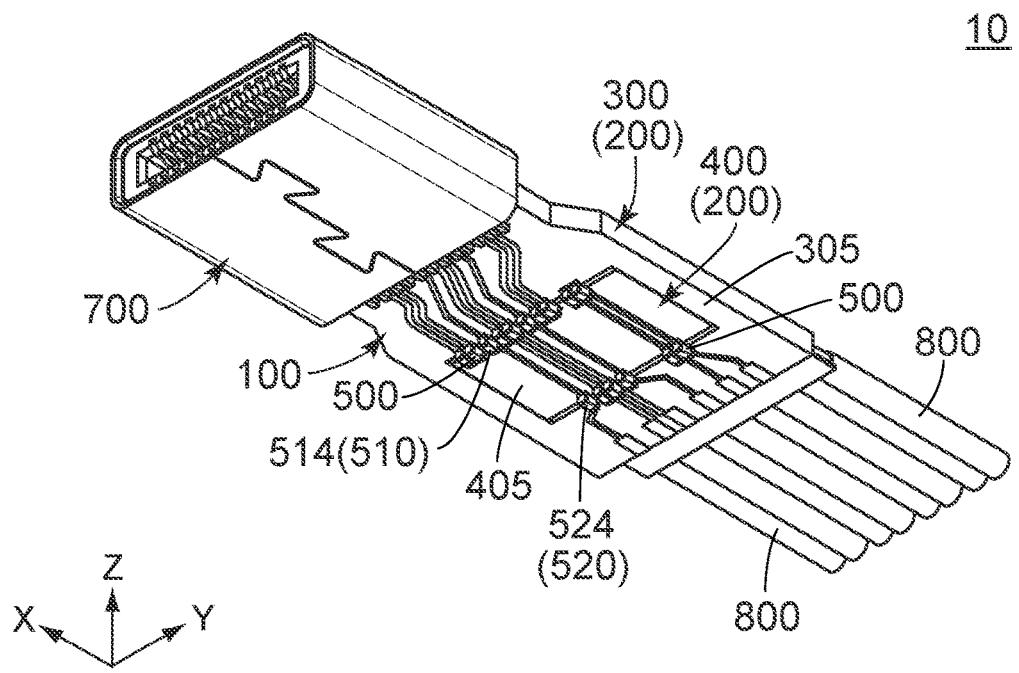
FIG. 4 is a lower, perspective view showing the harness assembly of FIG. 1.

As shown in FIG. 3, the main circuit board 300 further comprises a main inner conductor 340.

Figure 18:
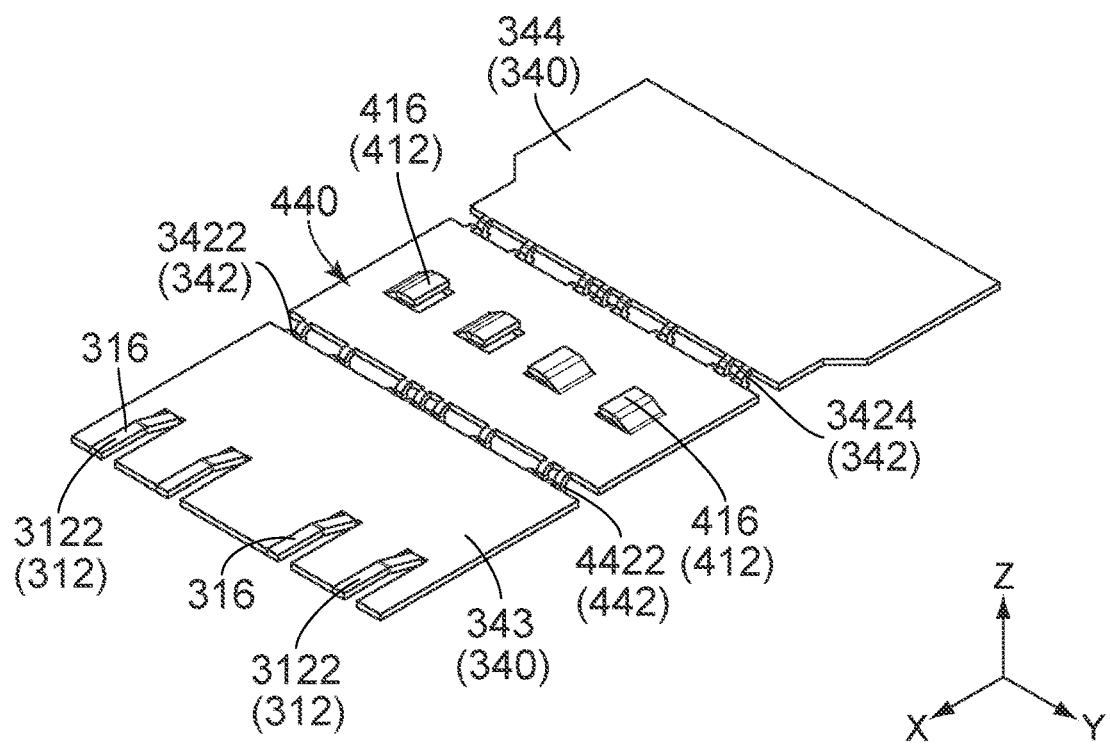
FIG. 18 is an upper, perspective view showing a main inner conductor and a supplemental inner conductor which are included in the circuit board structure of FIG. 13.

Referring to FIG. 18, the main inner conductor 340 of the present embodiment is made of metal. The main inner conductor 340 has a substantially plate-like shape. As shown in FIG. 3, a part of the main inner conductor 340 is embedded in the main holding member 305. The main inner conductor 340 forms a ground plane and prevents electrical interference between any of the main traces 314 and any of the first lower main conductive portions 3222 and between any of the second upper main conductive portions 3124 and any of the second lower main conductive portions 3224. The main inner conductor 340 has a front main inner conductor 343 and a rear main inner conductor 344.

Figure 19:
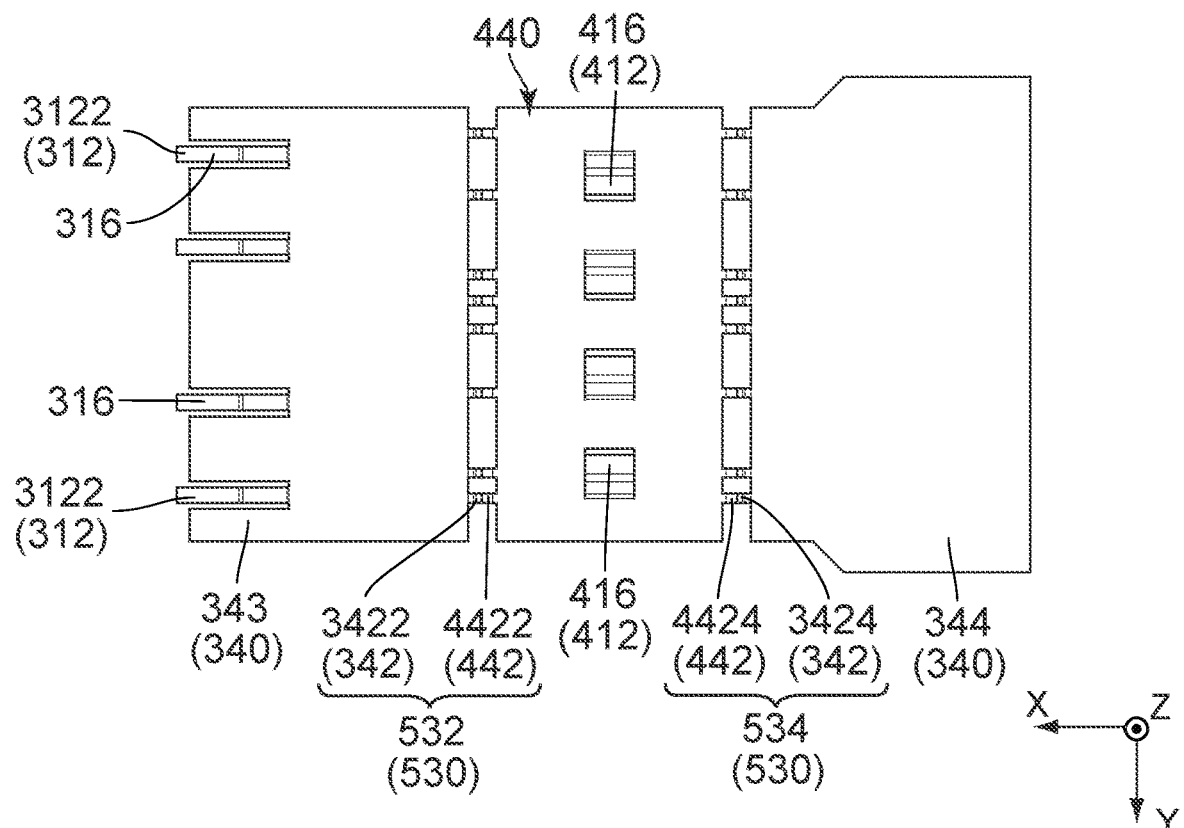
FIG. 19 is a top view showing the main inner conductor and the supplemental inner conductor of FIG. 18.
Figure 20:
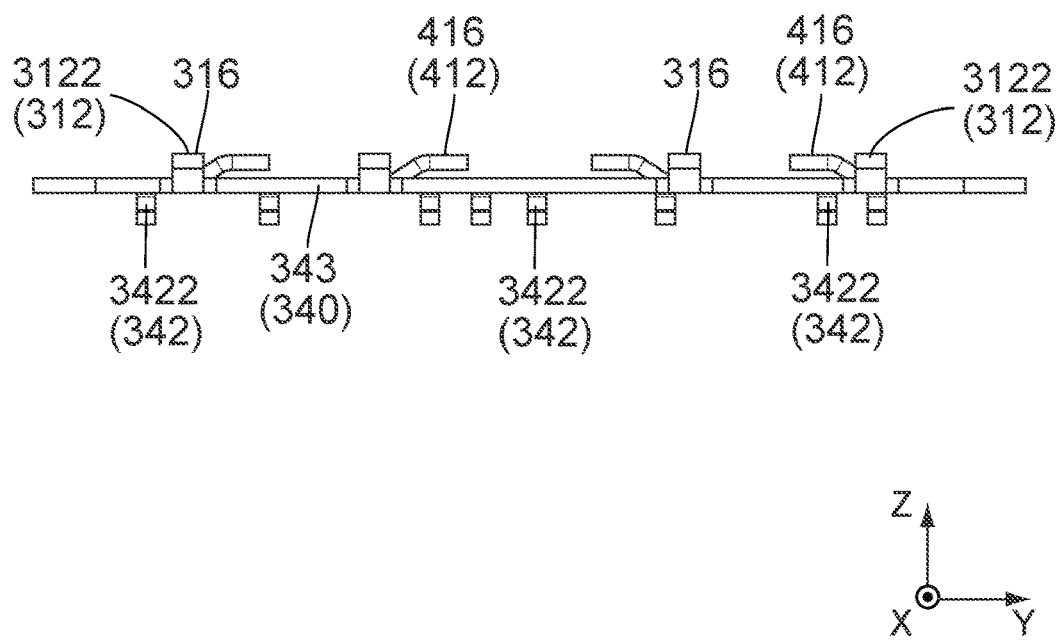
FIG. 20 is a front view showing the main inner conductor and the supplemental inner conductor of FIG. 18.
Figure 21:
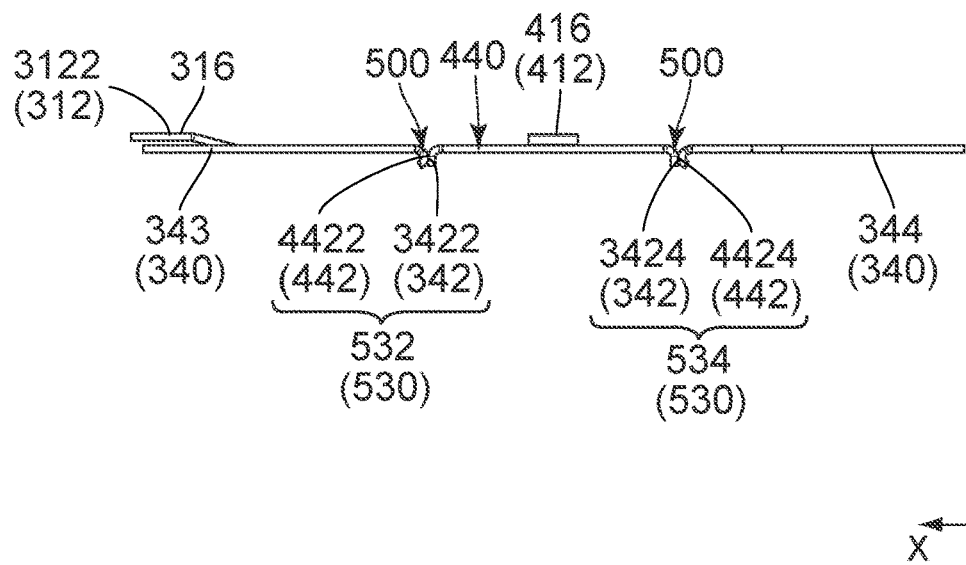
FIG. 21 is a side view showing the main inner conductor and the supplemental inner conductor of FIG. 18.

As shown in FIG. 19, the front main inner conductor 343 and the rear main inner conductor 344 of the present embodiment are distinct and separated from each other. The front main inner conductor 343 defines a front end of the main inner conductor 340 in the front-rear direction. The front main inner conductor 343 is positioned forward of the rear main inner conductor 344 in the front-rear direction. As understood from FIGS. 14 and 18, the front main inner conductor 343 is connected with any of the ground connection portions 316. In other words, the main inner conductor 340 is connected with ones of the upper main conductive portions 312. It is noted that the front main inner conductor 343 is not connected with any of the main traces 314.

As shown in FIGS. 14 and 19, the rear main inner conductor 344 of the present embodiment defines a rear end of the main inner conductor 340 in the front-rear direction. The rear main inner conductor 344 defines the rear end 304 of the main circuit board 300 in the front-rear direction. The rear main inner conductor 344 is positioned rearward of the front main inner conductor 343 in the front-rear direction. As shown in FIG. 14, a rear part of the rear main inner conductor 344 is exposed from the main holding member 305. As shown in FIG. 7, the outer conductor 820 of each of the electrical wires 800 is connected with the rear part of the rear main inner conductor 344.

As shown in FIG. 3, the main circuit board 300 has main exposed conductive portions 342. Each of the main exposed conductive portions 342 is a part of the main inner conductor 340.

As shown in FIG. 22, each of the main exposed conductive portions 342 of the present embodiment is exposed on the inner wall surface 352 of the accommodating portion 350. Each of the main exposed conductive portions 342 is exposed from the main holding member 305. The main exposed conductive portion 342 has a resilient property. In other words, the main exposed conductive portion 342 is configured to be resiliently deformable. As shown in FIG. 19, the main exposed conductive portion 342 is connected with the ground connection portion 316. In other words, the main exposed conductive portion 342 is connected with the upper main conductive portion 312. Referring to FIG. 22, the main exposed conductive portion 342 is not connected with the upper main conductive portion 312 on the inner wall surface 352 of the accommodating portion 350.

As shown in FIG. 19, the main exposed conductive portions 342 include front main exposed conductive portions 3422 and rear main exposed conductive portions 3424.

As shown in FIG. 19, each of the front main exposed conductive portions 3422 of the present embodiment is provided at the front main inner conductor 343. More specifically, each of the front main exposed conductive portions 3422 is provided at a rear end of the front main inner conductor 343. Each of the front main exposed conductive portions 3422 is connected with any of the ground connection portions 316.

As shown in FIG. 19, each of the rear main exposed conductive portions 3424 of the present embodiment is provided at the rear main inner conductor 344. More specifically, each of the rear main exposed conductive portions 3424 is provided at a front end of the rear main inner conductor 344.

As shown in FIG. 22, the main circuit board 300 has regulating portions 360.

As shown in FIG. 22, each of the regulating portions 360 of the present embodiment is recessed outward in a right-left direction. Each of the regulating portions 360 communicates with the accommodating portion 350 in the right-left direction. In the present embodiment, the right-left direction is a Y-direction. Each of the regulating portions 360 opens upward in the up-down direction.

As shown in FIG. 22, the supplemental circuit board 400 of the present embodiment is distinct and separated from the main circuit board 300. As shown in FIG. 14, the supplemental circuit board 400 has a supplemental holding member 405. The supplemental holding member 405 is made of resin. It is noted that the supplemental circuit board 400 is not a glass epoxy substrate.

As understood from FIGS. 3 and 14, the supplemental circuit board 400 of the present embodiment is completely accommodated in the accommodating portion 350. In other words, the supplemental circuit board 400 does not protrude in the up-down direction from the main circuit board 300 when the supplemental circuit board 400 is accommodated in the accommodating portion 350. However, the present invention is not limited thereto, but the supplemental circuit board 400 should be, at least in part, accommodated in the accommodating portion 350. Thus, the circuit board structure 200 of the present embodiment has a reduced size in the height direction.

Referring to FIGS. 14 and 16, the supplemental circuit board 400 has an upper surface 410 and a lower surface 420 in the up-down direction.

As shown in FIG. 14, the upper surface 410 of the present embodiment faces upward in the up-down direction. The upper surface 410 is a plane perpendicular to the up-down direction. The supplemental circuit board 400 has a plurality of upper supplemental conductive portions 412 which are formed on the upper surface 410.

As shown in FIG. 14, the upper supplemental conductive portions 412 of the present embodiment include supplemental traces 414 and connected portions 416.

As shown in FIG. 14, each of the supplemental traces 414 of the present embodiment is exposed on the upper surface 410 of the supplemental circuit board 400. The supplemental traces 414 include front supplemental traces 4142 and rear supplemental traces 4144.

As shown in FIG. 14, each of the front supplemental traces 4142 of the present embodiment extends in the front-rear direction and reaches a front end of the supplemental circuit board 400. Each of the front supplemental traces 4142 is positioned forward of any of the rear supplemental traces 4144 in the front-rear direction.

As shown in FIG. 14, each of the rear supplemental traces 4144 of the present embodiment extends in the front-rear direction and reaches a rear end of the supplemental circuit board 400. Each of the rear supplemental traces 4144 is positioned rearward of any of the front supplemental traces 4142 in the front-rear direction.

As shown in FIGS. 14, each of the connected portions 416 of the present embodiment is exposed on the upper surface 410 of the supplemental circuit board 400. Each of the connected portions 416 is positioned at a middle of the supplemental circuit board 400 in the front-rear direction. Each of the connected portions 416 is positioned between any of the front supplemental traces 4142 and any of the rear supplemental traces 4144 in the front-rear direction.

As shown in FIG. 16, the lower surface 420 of the present embodiment faces downward in the up-down direction. The lower surface 420 is a plane perpendicular to the up-down direction. The supplemental circuit board 400 has a plurality of lower supplemental conductive portions 422 which are formed on the lower surface 420.

Each of the lower supplemental conductive portions 422 is exposed on the lower surface 420 of the supplemental circuit board 400.

Figure 24:
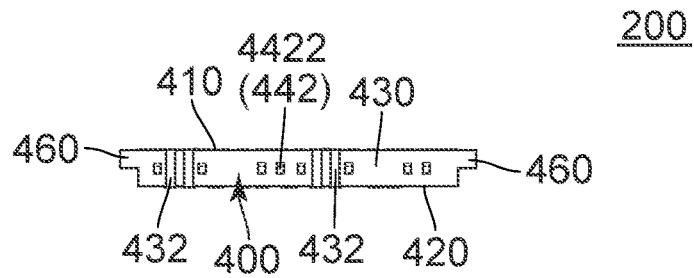
FIG. 24 is a front view showing the circuit board structure of FIG. 22.
Figure 24:
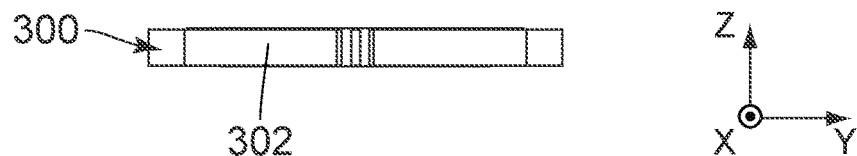
Figure 25:
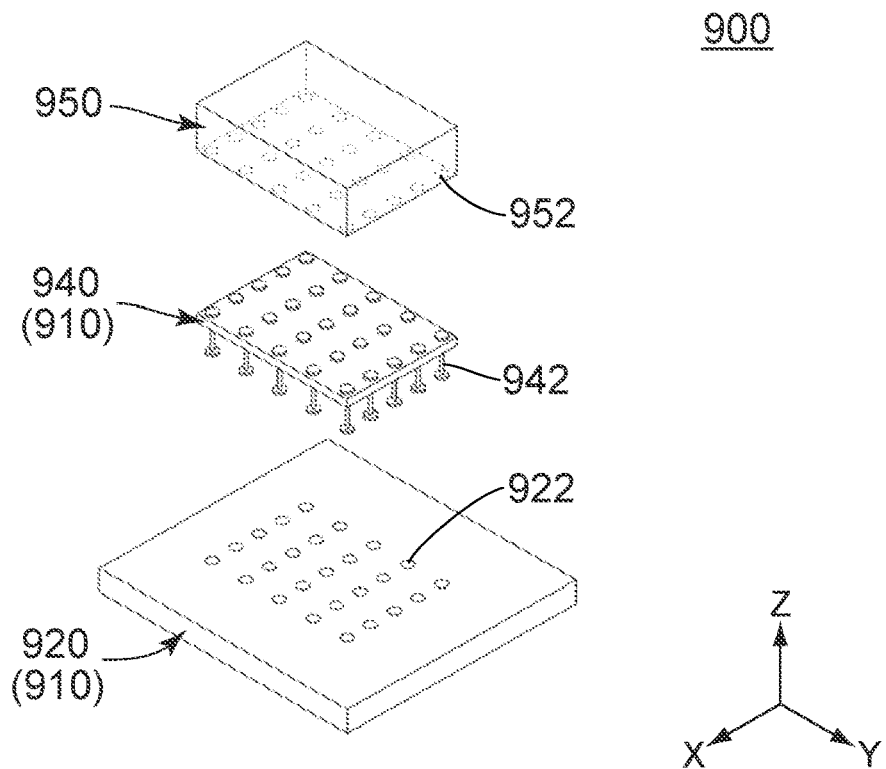
FIG. 25 is a perspective view showing an assembly of Patent Document 1.
Figure 26:
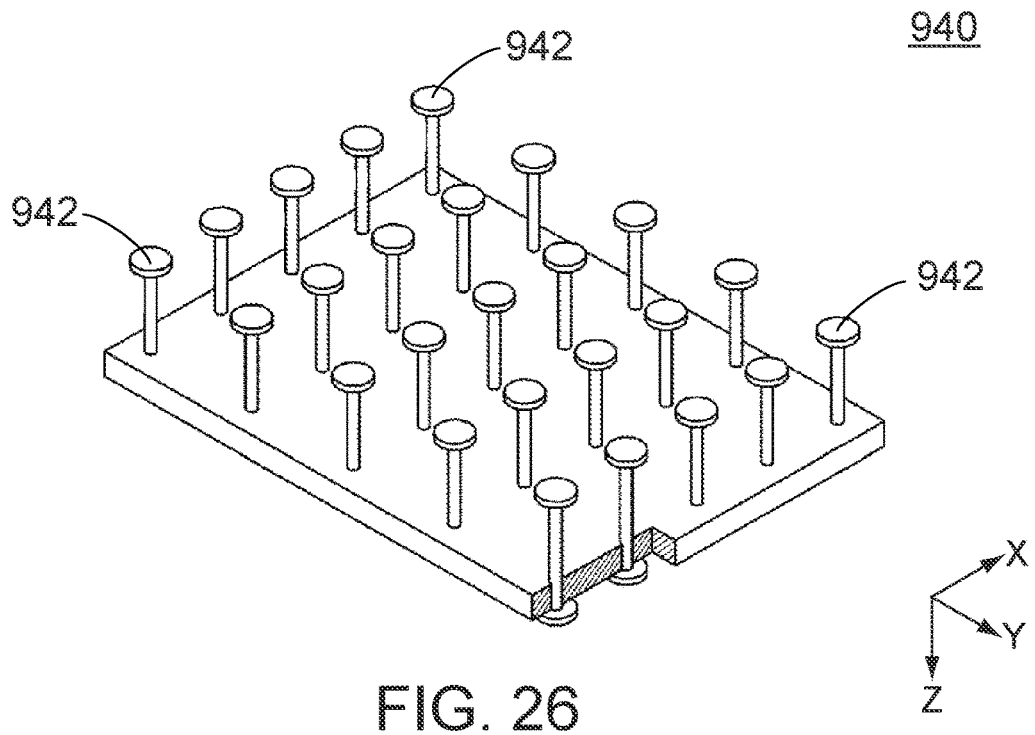
FIG. 26 is a partially cut-away, perspective view showing an interposer which is included in the assembly of FIG. 25.

As shown in FIG. 24, the supplemental circuit board 400 has side surfaces 430 in a direction perpendicular to the up-down direction.

As shown in FIG. 3, each of the side surfaces 430 of the present embodiment defines an end portion of the supplemental circuit board 400 in the front-rear direction. More specifically, the supplemental circuit board 400 has two of the side surfaces 430. One of the side surfaces 430 is a front surface of the supplemental circuit board 400, and a remaining one of the side surfaces 430 is a rear surface of the supplemental circuit board 400.

As shown in FIG. 3, the supplemental circuit board 400 further comprises a supplemental inner conductor 440.

Referring to FIG. 18, the supplemental inner conductor 440 of the present embodiment is made of metal. The supplemental inner conductor 440 has a substantially plate-like shape. The supplemental inner conductor 440 forms a ground plane and prevents electrical interference between any of the supplemental traces 414 and any of the lower supplemental conductive portions 422. Each of the connected portions 416 is connected with the supplemental inner conductor 440. In other words, the supplemental inner conductor 440 is connected with ones of the upper supplemental conductive portions 412. It is noted that none of the supplemental traces 414 are connected with the supplemental inner conductor 440. As shown in FIG. 3, a part of the supplemental inner conductor 440 is embedded in the supplemental holding member 405. The supplemental inner conductor 440 is positioned between the front main inner conductor 343 and the rear main inner conductor 344 in the front-rear direction when the supplemental circuit board 400 is accommodated in the accommodating portion 350. Specifically, the front main inner conductor 343 is positioned forward of the supplemental inner conductor 440 in the front-rear direction when the supplemental circuit board 400 is accommodated in the accommodating portion 350. In addition, the rear main inner conductor 344 is positioned rearward of the supplemental inner conductor 440 in the front-rear direction when the supplemental circuit board 400 is accommodated in the accommodating portion 350.

As shown in FIGS. 24, the supplemental circuit board 400 has supplemental exposed conductive portions 432, 442.

As shown in FIG. 24, the supplemental exposed conductive portions 432, 442 of the present embodiment are exposed on the side surfaces 430. The supplemental exposed conductive portion 432 is also referred to as a side connection portion 432. The supplemental exposed conductive portion 442 is also referred to as a supplemental inner conductor exposed portion 442.

Figure 23:
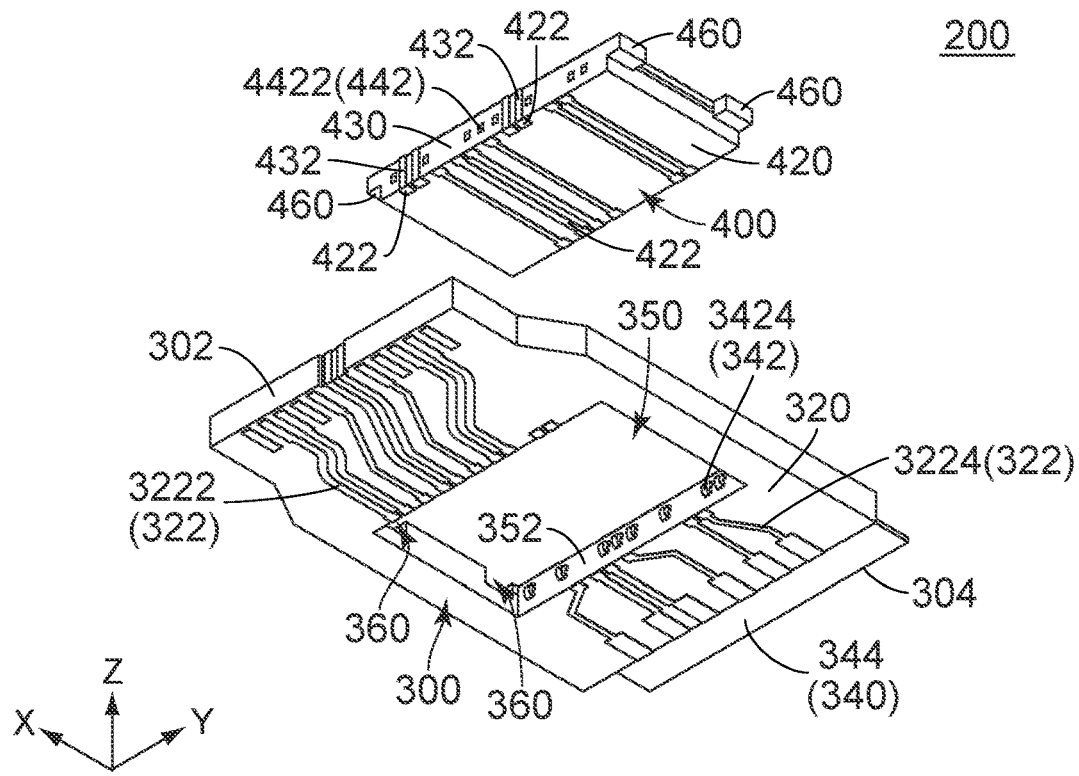
FIG. 23 is a lower, perspective view showing the circuit board structure of FIG. 22.

As shown in FIG. 22, the side connection portions 432 of the present embodiment are provided on the side surfaces 430 of the supplemental circuit board 400. The side connection portion 432 is connected with the supplemental trace 414 on the side surface 430 of the supplemental circuit board 400. In other words, the supplemental exposed conductive portion 432 is connected with the upper supplemental conductive portion 412 on the side surface 430 of the supplemental circuit board 400. Referring to FIGS. 22 and 23, each of the side connection portions 432 extends from the upper surface 410 of the supplemental circuit board 400 to the lower surface 420 of the supplemental circuit board 400. Each of ones of the lower supplemental conductive portions 422 is connected with a respective one of the supplemental traces 414 by a respective one of the side connection portions 432. In other words, each of the ones of the lower supplemental conductive portions 422 is connected with a respective one of the upper supplemental conductive portions 412 by the respective one of the side connection portions 432.

As described above, the supplemental circuit board 400 is not a glass epoxy substrate, the part of the supplemental inner conductor 440 is embedded in the supplemental holding member 405 made of resin, and the supplemental circuit board 400 is provided with the side connection portions 432 each of which connects the upper supplemental conductive portion 412 with the lower supplemental conductive portion 422. In a situation where a supplemental circuit board 400 is formed of a glass epoxy substrate while a supplemental inner conductor 440 is formed of an inner layer of the glass epoxy substrate, a portion equivalent to the side connection portion 432 cannot be formed on a side surface of the glass epoxy substrate. Accordingly, in this situation, the glass epoxy substrate is formed with, instead of the side connection portion 432, a via hole which connects the upper supplemental conductive portion 412 with the lower supplemental conductive portion 422. In this case, the inner layer, which corresponds to the supplemental inner conductor 440, must be formed so as to be away from and in no contact with the via hole. Thus, the inner layer in this case has a drawback of lack of shielding between the supplemental trace 414 and the lower supplemental conductive portion 422 at a location where the inner layer is away from and in no contact with the via hole. In contrast, the supplemental circuit board 400 of the present embodiment is configured so that the side connection portions 432, each of which connects the upper supplemental conductive portion 412 with the lower supplemental conductive portion 422, are provided on the side surfaces 430. Accordingly, the supplemental circuit board 400 of the present embodiment does not have the drawback of the lack of shielding as described above. Specifically, in the supplemental circuit board 400 of the present embodiment, the supplemental inner conductor 440 can provide full shielding between any of the supplemental traces 414 and any of the lower supplemental conductive portions 422, and thereby the supplemental inner conductor 440 provides an increased shielding effect.

It is noted that the main circuit board 300 of the present embodiment also has the same effect as the effect of the supplemental circuit board 400 as described above.

As shown in FIG. 19, each of the supplemental inner conductor exposed portions 442 of the present embodiment is a part of the supplemental inner conductor 440. In other words, each of the supplemental exposed conductive portions 442 is the part of the supplemental inner conductor 440. Each of the supplemental inner conductor exposed portions 442 is connected with any of the connected portions 416. In other words, the supplemental exposed conductive portion 442 is connected with the upper supplemental conductive portions 412. As shown in FIG. 3, the main exposed conductive portion 342 and the supplemental inner conductor exposed portion 442 are in contact with each other when the supplemental circuit board 400 is accommodated in the accommodating portion 350. Specifically, the main exposed conductive portion 342 is connected with the supplemental inner conductor exposed portion 442 when the supplemental circuit board 400 is accommodated in the accommodating portion 350. In other words, the main exposed conductive portion 342 is connected with the supplemental exposed conductive portion 442 when the supplemental circuit board 400 is accommodated in the accommodating portion 350. The supplemental inner conductor exposed portion 442 is not configured so as to be resiliently deformable.

Although the circuit board structure 200 of the present embodiment is configured so that the main exposed conductive portion 342 has the resilient property as described above, the present invention is not limited thereto. Specifically, the supplemental inner conductor exposed portion 442 may have a resilient property. In other words, at least one of the main exposed conductive portion 342 and the supplemental exposed conductive portion 442 should have a resilient property. This can ensure a stable connection of the main exposed conductive portion 342 with the supplemental exposed conductive portion 442 when the supplemental circuit board 400 is accommodated in the accommodating portion 350.

As shown in FIG. 19, the supplemental inner conductor exposed portions 442 include front supplemental inner conductor exposed portions 4422 and rear supplemental inner conductor exposed portions 4424.

As shown in FIG. 19, the front supplemental inner conductor exposed portion 4422 of the present embodiment defines the front end of the supplemental circuit board 400 in the front-rear direction. Each of the front supplemental inner conductor exposed portions 4422 is positioned forward of any of the rear supplemental inner conductor exposed portions 4424 in the front-rear direction. Each of the front supplemental inner conductor exposed portions 4422 is positioned forward of any of the connected portions 416 in the front-rear direction. As shown in FIG. 3, the front supplemental inner conductor exposed portion 4422 is connected with the front main exposed conductive portion 3422 when the supplemental circuit board 400 is accommodated in the accommodating portion 350.

As shown in FIG. 19, the rear supplemental inner conductor exposed portion 4424 of the present embodiment defines the rear end of the supplemental circuit board 400 in the front-rear direction. Each of the rear supplemental inner conductor exposed portions 4424 is positioned rearward of any of the front supplemental inner conductor exposed portions 4422 in the front-rear direction. Each of the rear supplemental inner conductor exposed portions 4424 is positioned rearward of any of the connected portions 416 in the front-rear direction. As shown in FIG. 3, the rear supplemental inner conductor exposed portion 4424 is connected with the rear main exposed conductive portion 3424 when the supplemental circuit board 400 is accommodated in the accommodating portion 350.

As shown in FIG. 22, the supplemental circuit board 400 has regulated portions 460.

As shown in FIG. 22, each of the regulated portions 460 of the present embodiment protrudes outward in the right-left direction. The regulated portions 460 correspond to the regulating portions 360, respectively. Referring to FIGS. 14 and 22, each of the regulated portions 460 is accommodated in the corresponding regulating portion 360 when the supplemental circuit board 400 is accommodated in the accommodating portion 350. This prevents deviation of the supplemental circuit board 400 with respect to the main circuit board 300 in a perpendicular plane perpendicular to the up-down direction when the supplemental circuit board 400 is accommodating in the accommodating portion 350.

As shown in FIGS. 3 and 19, the connection portions 500 of the present embodiment include first connection portions 510, second connection portions 520 and third connection portions 530.

Referring to FIG. 3, each of the first connection portions 510 of the present embodiment is distinct and separated from the circuit board structure 200. More specifically, each of the first connection portions 510 is a chip capacitor or zero-ohm resistor. The first connection portions 510 include first upper connection portions 512 and first lower connection portions 514.

As shown in FIG. 2, each of the first upper connection portions 512 of the present embodiment is positioned on the upper surface 310 of the main circuit board 300. Each of the first upper connection portions 512 is positioned on the upper surface 410 of the supplemental circuit board 400. Referring to FIGS. 2 and 14, the first upper connection portion 512 connects the main trace 314 of the first upper main conductive portion 3122 and the front supplemental trace 4142 of the supplemental trace 414 of the upper supplemental conductive portion 412 with each other.

Figure 5:
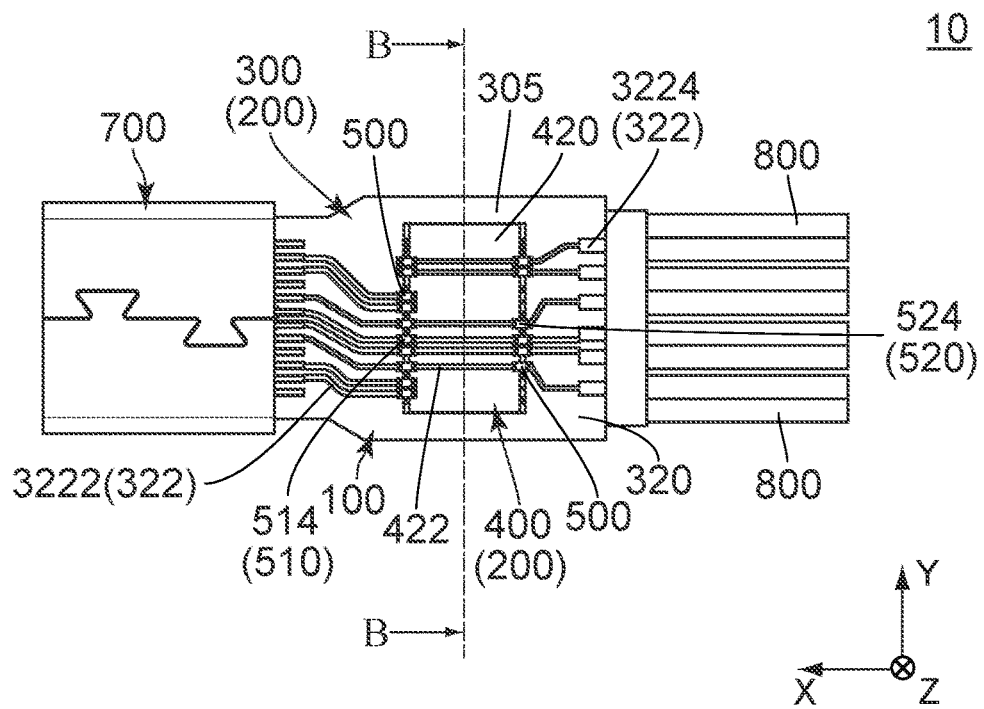
FIG. 5 is a bottom view showing the harness assembly of FIG. 1.

As shown in FIG. 5, each of the first lower connection portions 514 of the present embodiment is positioned on the lower surface 320 of the main circuit board 300. Each of the first lower connection portions 514 is positioned on the lower surface 420 of the supplemental circuit board 400. Referring to FIGS. 5 and 16, the first lower connection portion 514 connects the first lower main conductive portion 3222 and the lower supplemental conductive portion 422 with each other.

Referring to FIG. 3, each of the second connection portions 520 of the present embodiment is distinct and separated from the circuit board structure 200. More specifically, each of the second connection portions 520 is a chip capacitor or zero-ohm resistor.

As described above, each of the first connection portions 510 and the second connection portions 520 is distinct and separated from the circuit board structure 200. In other words, each of ones of the connection portions 500 is distinct and separated from the circuit board structure 200.

Referring to FIG. 3, the second connection portions 520 include second upper connection portions 522 and second lower connection portions 524.

As shown in FIG. 2, each of the second upper connection portions 522 of the present embodiment is positioned on the upper surface 310 of the main circuit board 300. Each of the second upper connection portions 522 is positioned on the upper surface 410 of the supplemental circuit board 400. Referring to FIGS. 2 and 14, the second upper connection portion 522 connects the rear supplemental trace 4144 of the supplemental trace 414 of the upper supplemental conductive portion 412 and the second upper main conductive portion 3124 with each other.

As shown in FIG. 5, each of the second lower connection portions 524 of the present embodiment is positioned on the lower surface 320 of the main circuit board 300. Each of the second lower connection portions 524 is positioned on the lower surface 420 of the supplemental circuit board 400. Referring to FIGS. 5 and 16, the second lower connection portion 524 connects the lower supplemental conductive portion 422 and the second lower main conductive portion 3224 with each other.

As described above, the first lower connection portion 514 connects the first lower main conductive portion 3222 and the lower supplemental conductive portion 422 with each other, and the second lower connection portion 524 connects the lower supplemental conductive portion 422 and the second lower main conductive portion 3224 with each other. In other words, each of ones of the connection portions 500 connects a respective one of the lower main conductive portions 322 and a respective one of the lower supplemental conductive portions 422 with each other.

As shown in FIG. 19, the third connection portions 530 of the present embodiment include third front connection portions 532 and third rear connection portions 534.

As shown in FIG. 19, each of the third front connection portions 532 of the present embodiment consists of the front main exposed conductive portion 3422 and the front supplemental inner conductor exposed portion 4422. The front main inner conductor 343 and the supplemental inner conductor 440 are connected with each other via any of the third front connection portions 532. As described above, the ground connection portion 316 is connected with the front main inner conductor 343, and the connected portion 416 is connected with the supplemental inner conductor 440. Thus, the third front connection portion 532 connects the ground connection portion 316 and the connected portion 416 with each other.

As described above, the first upper connection portion 512 connects the main trace 314 and the front supplemental trace 4142 with each other, the second upper connection portion 522 connects the rear supplemental trace 4144 and the second upper main conductive portion 3124 with each other, and the third front connection portion 532 connects the ground connection portion 316 and the connected portion 416 with each other. In other words, each of ones of the connection portions 500 connects a respective one of the upper main conductive portions 312 and a respective one of the upper supplemental conductive portions 412 with each other.

As shown in FIG. 19, each of the third rear connection portions 534 of the present embodiment consists of the rear supplemental inner conductor exposed portion 4424 and the rear main exposed conductive portion 3424. The supplemental inner conductor 440 and the rear main inner conductor 344 are connected with each other via any of the third rear connection portions 534.

As shown in FIG. 1, the assembly 100 further comprises a device 600.

Figure 6:
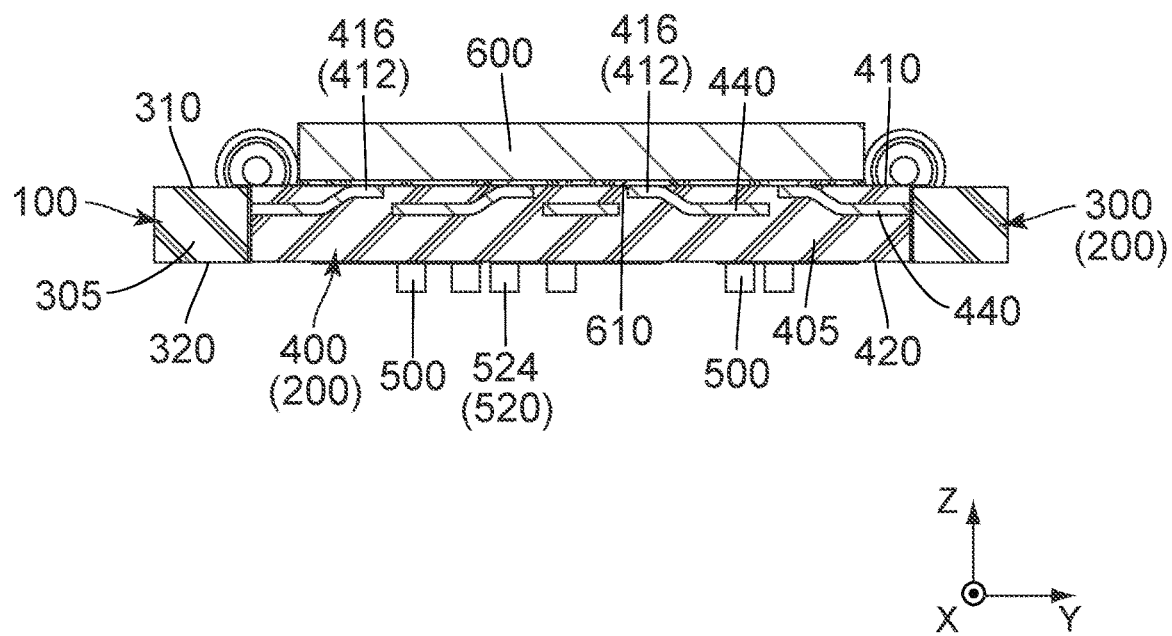
FIG. 6 is a cross-sectional view showing the harness assembly of FIG. 5, taken along line B-B.

Referring to FIG. 6, the device 600 of the present embodiment is a semiconductor element. The device 600 is mounted on the supplemental circuit board 400. The device 600 has device connection portions 610. The device connection portion 610 is connected with the upper supplemental conductive portion 412. More specifically, referring to FIGS. 6 and 14, each of ones of the device connection portions 610 is connected with a respective one of the supplemental traces 414. In addition, each of remaining ones of the device connection portions 610 is connected with a respective one of the connected portions 416. Since each of the connected portions 416 is connected with the supplemental inner conductor 440 as described above, the device 600 is connected with the supplemental inner conductor 440 via the device connection portions 610 and the connected portions 416. Thus, the device 600 can use the supplemental inner conductor 440 as a heat sink which draws heat away from the device 600. The device 600 connects the front supplemental trace 4142 and the rear supplemental trace 4144 with each other.

As described above, the first upper connection portion 512 connects the main trace 314 and the front supplemental trace 4142 with each other, the device 600 connects the front supplemental trace 4142 and the rear supplemental trace 4144 with each other, and the second upper connection portion 522 connects the rear supplemental trace 4144 and the second upper main conductive portion 3124 with each other. In other words, the first upper main conductive portion 3122 is connected with the second upper main conductive portion 3124 via the upper supplemental conductive portions 412, the device 600 and ones of the connection portions 500.

Although the specific explanation about the present invention is made above referring to the embodiments, the present invention is not limited thereto and is susceptible to various modifications and alternative forms.

Although the main circuit board 300 of the present embodiment is configured so that the main exposed conductive portion 342 is not connected with the upper main conductive portion 312 on the inner wall surface 352 of the accommodating portion 350, the present invention is not limited thereto. Specifically, the main exposed conductive portion 342 may be connected with the upper main conductive portion 312 on the inner wall surface 352 of the accommodating portion 350.

Although the assembly 100 of the present embodiment comprises the device 600, the present invention is not limited thereto, but the assembly 100 may comprise no device 600. In this case, the upper surface 410 of the supplemental circuit board 400 is formed with no connected portion 416, but formed only with the supplemental traces 414. Specifically, the front supplemental trace 4142 and the rear supplemental trace 4144 are directly connected with each other in this case. Accordingly, if the assembly 100 comprises no device 600, the first upper main conductive portion 3122 should be connected with the second upper main conductive portion 3124 via the upper supplemental conductive portion 412 and ones of the connection portions 500.

Although the harness assembly 10 of the present embodiment comprises the assembly 100, the connector 700 and the electrical wires 800, the present invention is not limited thereto. Specifically, the harness assembly 10 may comprises no connector 700. In other words, the harness assembly 10 may comprise only a set of the assembly 100 and the electrical wires 800. In this case, the front end 302 of the main circuit board 300 of the assembly 100 functions as a card edge connector.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. An assembly comprising a circuit board structure and a plurality of connection portions, wherein:
   the circuit board structure has a main circuit board and a supplemental circuit board;
   the main circuit board has an upper surface and a lower surface in an up-down direction;
   the main circuit board is formed with an accommodating portion;
   the accommodating portion is recessed downward in the up-down direction from the upper surface of the main circuit board;
   the main circuit board has a plurality of upper main conductive portions;
   the upper main conductive portions are formed on the upper surface of the main circuit board;
   the supplemental circuit board has an upper surface and a lower surface in the up-down direction;
   the supplemental circuit board has a plurality of upper supplemental conductive portions;
   the upper supplemental conductive portions are formed on the upper surface of the supplemental circuit board;
   the supplemental circuit board is, at least in part, accommodated in the accommodating portion;
   each of ones of the connection portions connects a respective one of the upper main conductive portions and a respective one of the upper supplemental conductive portions with each other;
   the accommodating portion pierces the main circuit board in the up-down direction;
   the main circuit board has a plurality of lower main conductive portions;
   the lower main conductive portions are formed on the lower surface of the main circuit board;
   the supplemental circuit board has a plurality of lower supplemental conductive portions;
   the lower supplemental conductive portions are formed on the lower surface of the supplemental circuit board; and
   each of ones of the connection portions connects a respective one of the lower main conductive portions and a respective one of the lower supplemental conductive portions with each other.

2. The assembly as recited in claim 1, wherein:
   the supplemental circuit board has a side surface in a direction perpendicular to the up-down direction;
   the supplemental circuit board has a side connection portion;
   the side connection portion is provided on the side surface of the supplemental circuit board;
   the side connection portion extends from the upper surface of the supplemental circuit board to the lower surface of the supplemental circuit board; and
   one of the lower supplemental conductive portions is connected with one of the upper supplemental conductive portions by the side connection portion.

3. The assembly as recited in claim 1, wherein:
   the main circuit board has a main exposed conductive portion;
   the accommodating portion has an inner wall surface;
   the main exposed conductive portion is exposed on the inner wall surface of the accommodating portion;
   the main exposed conductive portion is connected with the upper main conductive portion;
   the supplemental circuit board has a side surface in a direction perpendicular to the up-down direction;
   the supplemental circuit board has a supplemental exposed conductive portion;
   the supplemental exposed conductive portion is exposed on the side surface; and
   the supplemental exposed conductive portion is connected with the upper supplemental conductive portion.

4. The assembly as recited in claim 3, wherein the supplemental exposed conductive portion is connected with the upper supplemental conductive portion on the side surface of the supplemental circuit board.

5. The assembly as recited in claim 3, wherein:
   the main circuit board further comprises a main inner conductor;
   the main inner conductor is connected with the upper main conductive portion;
   the main exposed conductive portion is a part of the main inner conductor;
   the supplemental circuit board further comprises a supplemental inner conductor;
   the supplemental inner conductor is connected with the upper supplemental conductive portion;
   the supplemental exposed conductive portion is a part of the supplemental inner conductor; and
   the main exposed conductive portion is connected with the supplemental exposed conductive portion when the supplemental circuit board is accommodated in the accommodating portion.

6. The assembly as recited in claim 3, wherein at least one of the main exposed conductive portion and the supplemental exposed conductive portion has a resilient property.

7. The assembly as recited in claim 1, wherein each of ones of the connection portions is distinct and separated from the circuit board structure.

8. The assembly as recited in claim 1, wherein:
   the upper main conductive portions include a first upper main conductive portion and a second upper main conductive portion;
   the first upper main conductive portion is positioned forward of the accommodating portion in a front-rear direction perpendicular to the up-down direction;
   the second upper main conductive portion is positioned rearward of the accommodating portion in the front-rear direction; and
   the first upper main conductive portion is connected with the second upper main conductive portion via the upper supplemental conductive portion and ones of the connection portions.

9. An assembly comprising a circuit board structure and a plurality of connection portions, wherein:
   the circuit board structure has a main circuit board and a supplemental circuit board;
   the main circuit board has an upper surface and a lower surface in an up-down direction;
   the main circuit board is formed with an accommodating portion;
   the accommodating portion is recessed downward in the up-down direction from the upper surface of the main circuit board;
   the main circuit board has a plurality of upper main conductive portions;
   the upper main conductive portions are formed on the upper surface of the main circuit board;

the supplemental circuit board has an upper surface and a lower surface in the up-down direction;

the supplemental circuit board has a plurality of upper supplemental conductive portions;

the upper supplemental conductive portions are formed on the upper surface of the supplemental circuit board;

the supplemental circuit board is, at least in part, accommodated in the accommodating portion;

each of ones of the connection portions connects a respective one of the upper main conductive portions and a respective one of the upper supplemental conductive portions with each other;

the assembly further comprises a device which has a device connection portion;

the device is mounted on the supplemental circuit board; and the device connection portion is connected with the upper supplemental conductive portion.

10. A harness assembly comprising the assembly as recited in claim 9, a connector and an electrical wire, wherein:

the main circuit board has a front end and a rear end in a front-rear direction perpendicular to the up-down direction;

the front end of the main circuit board is connected with the connector; and the rear end of the main circuit board is connected with the electrical wire.

* * * * *